United States Patent

[11] 3,628,244

[72] Inventor William M. Halstead
P.O. Box 881, Glen Burnie, Md. 21061

[21] Appl. No. 12,673
[22] Filed Feb. 19, 1970
[45] Patented Dec. 21, 1971

[54] METHOD AND TOOL FOR ASSEMBLING LEADS INTO CIRCUIT BOARD APERTURES
11 Claims, 9 Drawing Figs.

[52] U.S. Cl. .......... 29/626, 29/203 B, 29/203 D, 29/203 H
[51] Int. Cl. .......... H05k 3/30, H05k 13/04
[50] Field of Search .......... 29/203 B, 203 H, 626, 203 DT

[56] References Cited

UNITED STATES PATENTS

| | | | |
|---|---|---|---|
| 2,928,165 | 3/1960 | Carlzen et al. | 29/626 |
| 3,401,548 | 9/1968 | Ross et al. | 29/203 H X |

*Primary Examiner*—Thomas H. Eager
*Attorneys*—Munson H. Lane and Munson H. Lane, Jr.

ABSTRACT: A handle-equipped head of the tool is formed with open slots to receive rows of terminal leads of an electrical module so that the leads are straightened and aligned in the direction of the slots when the module is applied to the head. A separate attachment is applicable to the head with the module thereon and is provided with jaws having notches for receiving and straightening the leads so that they are aligned transversely of the slots for insertion in apertures of a printed circuit board while the module is being held by the tool.

INVENTOR
William M. Halstead
BY Munson H. Lane
ATTORNEY

METHOD AND TOOL FOR ASSEMBLING LEADS INTO CIRCUIT BOARD APERTURES

This invention relates to new and useful improvements in special tools for use with electrical components such as integrated circuit flat pack modules which are provided with parallel rows of terminal leads for insertion in apertures of a printed circuit board.

A module of this type may have two rows of leads with seven or 12 leads in each row, and expeditious installations of the module on a printed circuit board can be effected only if all the leads are straight and properly aligned for simultaneous insertion in the apertures of the board. It often happens that one or more of the leads become bent during storage or handling of the module, and must be straightened before the module can be installed. Individual straightening of each bent lead is a tedious task and often it is difficult to correctly align a bent lead with respect to the others, especially when some of the adjacent leads are also bent and therefore cannot be relied upon to provide an accurate guide as to proper alignment. It is, therefore, the principal object of the invention to facilitate easy and expeditious straightening of any bent leads of a module by the use of a simple tool which also serves to hold or carry the module while it is being installed on a printed circuit board. Thus, when the module is applied to the tool, its leads are straightened and properly aligned for insertion in apertures of the board while the module is being conveniently held by the tool.

The lead straightening and module installing tool of the present invention is a part of a family of special tools which I have designed for working with integrated circuit modules, as disclosed for example in my following patent applications:

Tool for Removing and Replacing Integrated Circuit Flat Pack Modules, Ser. No. 778,440, filed Nov. 25, 1968;

Handling and Heat Dissipating Device for Electrical Components, Ser. No. 849,831, filed Aug. 13, 1969; and Electrical Component Desoldering and Extracting Tool, Ser. No. 862,166, filed Sept. 30, 1969.

As are the others, the tool of the present invention is simple in construction, efficient and dependable in operation, and lends itself to economical manufacture.

With the foregoing more important object and features in view and such other objects which may become apparent as this specification proceeds, the invention will be understood from the following description taken in conjunction with the accompanying drawings, wherein like characters of reference are used to designate like parts, and wherein.

Figures 1, 3:
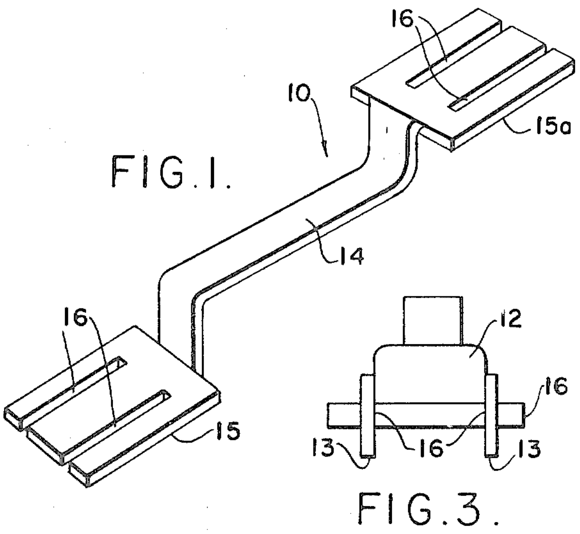
FIG. 1 is a perspective view of the tool with selectively usable heads at opposite ends of its handle.
FIG. 3 is an end view of the subject shown in FIG. 2.
Figure 2:
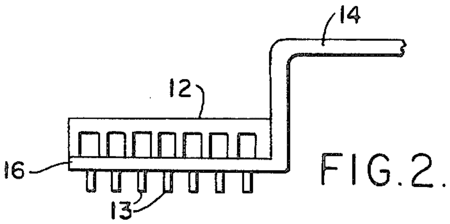
FIG. 2 is a fragmentary side elevational view showing a module in position on one of the heads.
Figure 4:
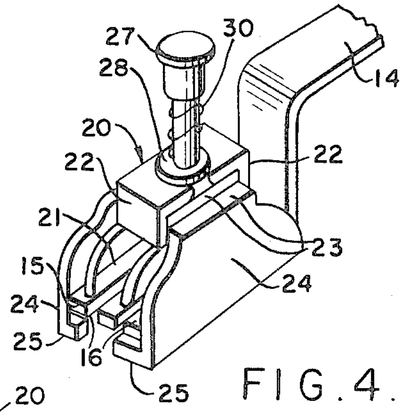
FIG. 4 is a fragmentary perspective view of a straightening attachment in position on one of the heads.
Figure 5:
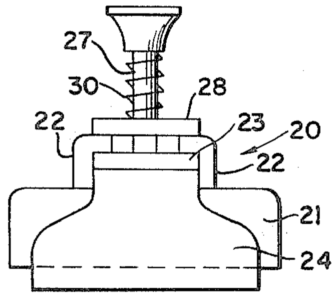
FIG. 5 is a side elevational view of the attachment per se.
Figure 6:
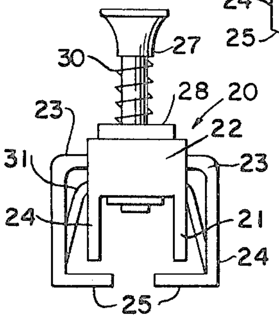
FIG. 6 is an end elevational view of the attachment.

Referring now to the accompanying drawings in detail, more particularly to FIGS. 1–3 inclusive, the module installing and lead straightening tool of the invention is designated generally by the numeral 10 and is intended for use with an integrated circuit module 12 having two parallel rows of terminal leads 13 projecting downwardly therefrom, it being understood that these leads must be straight and properly aligned before the module can be installed on a printed circuit board by inserting all the leads simultaneously into apertures with which the board is provided.

The tool 10 comprises a handle 14 provided at its opposite ends with a pair of selectively usable plate-shaped heads 15, 15*a*, each head being formed with a pair of slots 16 which are parallel and open at the end of the head remote from the handle. The two heads 15, 15*a* are identical in construction but are of different sizes, so that the head 15, for example, may accommodate a module having two rows of leads with seven leads in each row, while the head 15*a* may accommodate a larger module having, for example, two rows of leads with 12 leads in each row. The transverse spacing of the slots 16 in each head corresponds to the transverse spacing of the two rows of leads 13 of the module which is to be accommodated on that head, and the width of each slot corresponds to the thickness of the leads.

When the module is picked up for installation, some of its leads may be bent in a transverse direction, that is, out of longitudinal alignment in each row, as for example, when a lead in one row is bent transversely toward the leads in the other row. Also, the leads may be bent in a longitudinal direction, that is, in the plane of the row itself, as for example, when a lead in a row is bent longitudinally toward the next lead in the same row. The first mentioned bent lead condition is straightened out when the module is applied to the tool head, for example the head 15, by longitudinal movement parallel to the direction of the slots 16 so that the two rows of leads 13 enter the open end of the two slots and slide inwardly in the slots until the full length of the module is accommodated on the head 15 as shown in FIGS. 2 and 3. During this sliding application of the module to the tool head, any transversely bent leads of the module will be straightened into longitudinal alignment of their respective rows, and the module is ultimately seated in position by pressing it downwardly against the upper surface of the head while the leads project downwardly below the lower surface of the head, as illustrated.

Assuming that the module leads, after being straightened and longitudinally aligned by application of the module to the head 15 as above described, are also initially straight in the plane of their respective rows, the module may then be installed on a printed circuit board while in position on the head 15 and manipulated by the handle 14, which is preferably upwardly offset from the head as shown in FIG. 1 so that it may be conveniently grasped without interfering with the circuit board itself while the head with the module thereon is closely adjacent to the board.

After the projecting leads of the module are inserted in the board apertures, the tool may be withdrawn and the module pressed further against the board, if necessary.

While the aforementioned lead straightening procedure takes care of leads which have been in a transverse direction, that is from one row toward the other, it does not provide for straightening of leads which have been bent in the longitudinal direction, that is, toward the next lead in the same row. For this purpose the tool of the invention includes an attachment designated generally by the numeral 20 which is shown in FIGS. 4–9 and, in one of its uses, is applicable to the tool head 15 after the module is in position on the head, as already described.

Figure 7:
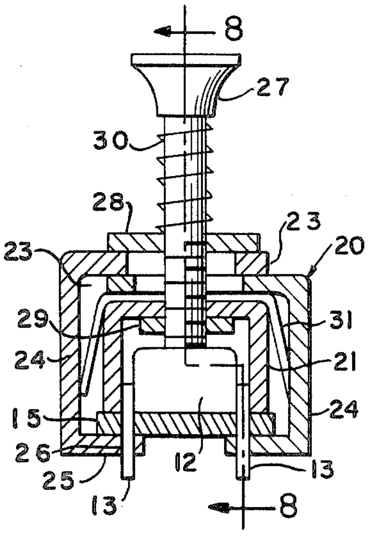
FIG. 7 is a vertical cross-sectional view showing a module and the attachment on one of the heads.
Figure 8:
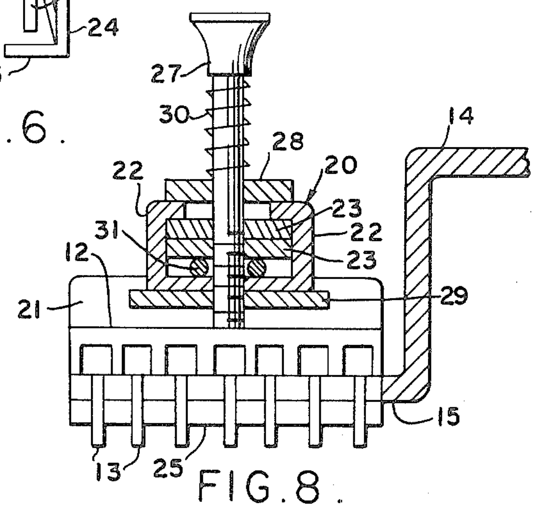
FIG. 8 is a fragmentary longitudinal sectional view, taken substantially in the plane of the line 8—8 in FIG. 7.
Figure 9:
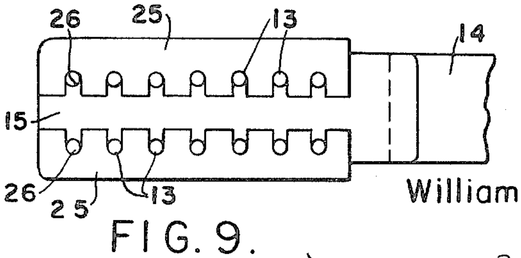
FIG. 9 is an underside plan view of the subject shown in FIG. 8.

The attachment 20 comprises an elongated, inverted U-shaped body 21 which is adapted to receive the module 12 therein while engaging the upper surface of the head 15 outside of the slots 16, as shown in FIG. 7. The top of the body 21 is provided with a pair of longitudinally opposing brackets 22 which act as a holder for slotted, superposed upper portions 23 of a pair of jaws 24. The jaws 24 are disposed exteriorly at opposite sides of the body 21 and have inturned, opposing lower portions 25 formed with notches 26. The inturned jaw portions 25 are located below the head 15 and the notches 26 are adapted to receive the downwardly projecting leads 13 of the module. The longitudinal spacing of the notches 26 of each jaw corresponds to the correct longitudinal spacing of the leads 13 in each row, and the notches in the two jaws are transversely aligned so that when the attachment 20 is applied to a module held on the head 15 of the tool 10, the leads of the module are straightened into parallelism with each other in the respective rows.

The jaws 24 are held assembled on the body 21 by a clamping screw 27 which passes freely through a washer 28 positioned on top of the brackets 22, then through the slotted jaw portions 23, then through an aperture in the top of the body 21, and then is screw threaded into a plate-shaped nut 29 inside the body 21. A compression spring 30 is positioned on the screw 27 between the screw head and the washer 28 in order to take up slack, it being noted that the jaws 24 are movably assembled on the body 21 by virtue of the slotted jaw portions 23 through which the screw 27 freely extends, thus making it possible for the two jaws to move transversely toward and away from each other while the attachment is being applied to or removed from the module on the associated supporting head 15. A leaf spring 31 is provided as shown in FIG. 7 to normally bias the two jaws apart.

In use, the attachment 20 is applied so as to slide longitudinally over the module on the head 15, and the jaws 24 are manually pressed together, against the action of the spring 31, so that the module leads 13 are received in the notches 26 of the jaws and are thereby properly aligned. The screw 27 may then be tightened to hold the module 12 pressed against the head 15 while at the same time locking the jaws 24 in their drawn together position, whereupon the entire tool may be manipulated so as to insert the leads of the module into the circuit board apertures. The tool 10 and the attachment 20 may then be withdrawn from the module, after loosening of the screw 27.

Although the attachment 20 is primarily intended to be used in conjunction with the tool 10 as already described, the attachment may also be used by itself, that is, without the tool 10, by simply inserting the module into the attachment and engaging the notched jaws 24 with the leads of the module. In this manner some straightening action of the leads will be effected and, upon tightening of the screw 27, the entire attachment will serve as a handle for placing the module in position on the circuit board.

I claim:

1. A tool for installing an electrical module on a printed circuit board where the module has two rows of terminal leads insertable in apertures in the board and where the leads may require to be straightened and aligned before insertion, said tool comprising a plate-shaped module supporting head and a handle thereon, said head being provided with a pair of parallel slots open at one end thereof for slidably receiving and straightening two rows of module leads inserted into the slots in a direction parallel to the slots, so that the leads are coplanar in each row when the module is supported on said head.

2. The device as defined in claim 1 wherein said handle is provided at one end of said head and said slots are open at the end of the head opposite from said handle.

3. The device as defined in claim 2 wherein said handle is offset vertically from said head.

4. The device as defined in claim 1 together with an attachment removably applicable to said head and to a module thereon for aligning the module leads into transversely coplanar relation, said attachment comprising a module receiving body, and a pair of jaws disposed at opposite sides of said body for movement transversely toward and away from each other, said jaws having inturned opposing portions below said body provided with lead receiving notches.

5. The device as defined in claim 4 together with resilient means biasing said jaws apart.

6. The device as defined in claim 4 together with clamping means for a module in said body and for simultaneously locking said jaws in their drawn together position.

7. A tool for installing an electrical module on a printed circuit board where the module has two rows of terminal leads insertable in apertures on the board and where the leads may require to be straightened and aligned before insertion, said tool comprising a module receiving body, and a pair of jaws disposed at opposite sides of said body for movement transversely toward and away from each other, said jaws having inturned opposing portions below said body provided with lead receiving notches.

8. The device as defined in claim 7 together with resilient means biasing said jaws apart.

9. The device as defined in claim 7 together with clamping means for a module in said body and for simultaneously locking said jaws in their drawn together position.

10. A method of installing an electrical module on a printed circuit board where the module has two rows of terminal leads insertable in apertures on the board and where the lead may require to be straightened and aligned before insertion, said method comprising the steps of (a) applying the module to a tool which has a slotted module supporting head so that the module leads are slidably inserted in the slots of the head in a direction parallel to the slots and the leads are thereby aligned into coplanar relation in each row, and (b) supporting the module with the aligned leads by said tool while the leads are inserted into circuit board apertures.

11. The method as defined in claim 10 together with the additional steps of (c) applying an attachment to the tool head with the module thereon, which attachment includes notched jaws to align the module leads in transversely coplanar relation, and (d) locking the attachment in place on the module and tool head while the module leads are inserted in the circuit board apertures.

* * * * *